United States Patent [19]

Lauke et al.

[11] Patent Number: 5,262,278
[45] Date of Patent: Nov. 16, 1993

[54] STORAGE-STABLE SOLUTION OF A CARBOXYL-CONTAINING COPOLYMER AND PRODUCTION OF PHOTOSENSITIVE COATINGS AND OFFSET PRINTING PLATES

[75] Inventors: Harald Lauke, Mannheim; Thomas Loerzer, Neustadt; Axel Sanner, Frankenthal; Joachim Roser, Mannheim, all of Fed. Rep. of Germany

[73] Assignee: BASF Aktiengesellschaft, Ludwigshafen, Fed. Rep. of Germany

[21] Appl. No.: 822,266

[22] Filed: Jan. 17, 1992

[30] Foreign Application Priority Data

Jan. 25, 1991 [DE] Fed. Rep. of Germany ....... 4102173

[51] Int. Cl.$^5$ .............................................. G03F 7/028
[52] U.S. Cl. .................................... 430/287; 430/918; 522/115
[58] Field of Search ................. 430/287, 918; 522/115

[56] References Cited

U.S. PATENT DOCUMENTS

| | | | |
|---|---|---|---|
| 3,427,161 | 2/1969 | Laridon et al. ...................... | 96/35.1 |
| 3,686,371 | 8/1972 | Hasegawa ............................ | 260/980 |
| 3,754,972 | 8/1973 | DeMajistre et al. ................... | 117/72 |
| 3,867,351 | 2/1975 | Juna et al. ................... | 260/77.5 CR |
| 3,984,500 | 10/1976 | Dickie et al. ......................... | 260/885 |
| 4,044,044 | 8/1977 | Saito .............................. | 260/47 UA |
| 4,239,850 | 12/1980 | Kita et al. ............................ | 430/281 |
| 4,258,123 | 3/1981 | Nagashima et al. ................ | 430/281 |
| 4,259,432 | 3/1981 | Kondoh et al. ...................... | 430/281 |
| 4,935,330 | 6/1990 | Hofmann et al. .................... | 430/281 |
| 5,069,929 | 12/1991 | Arai et al. ....................... | 522/115 X |

FOREIGN PATENT DOCUMENTS

| | | |
|---|---|---|
| 2083832 | 3/1982 | European Pat. Off. . |
| 0138187 | 1/1989 | European Pat. Off. . |
| 0422647 | 4/1991 | European Pat. Off. . |

OTHER PUBLICATIONS

C. Decker et al., "Elimination of Oxygen Inhibition in Photopolymerization", May-Jun. 1979, Photographic Science and Engineering, vol. 23, #3, pp. 137-140.

H. J. Timpe et al., "Photopolymersysteme Und Ihre Anwendungen", (1984), Chemische Technik, vol. 36, pp. 1-7.

Primary Examiner—Roland Martin
Attorney, Agent, or Firm—Keil & Weinkauf

[57] ABSTRACT

Storage-stable solutions of film forming carboxyl-containing copolymers, from 5 to 80% of whose carboxyl groups have been reacted with glycidyl (meth)acrylate, in an inert organic solvent or solvent mixture additionally contain a phosphoric ester of a hydroxyalkyl (meth)acrylate and, if required, orthophosphoric acid, and photosensitive coatings which contain a photoinitiator, ethylenically unsaturated organic monomeric compounds which can be subjected to free radical polymerization and, if required, plasticizers, dyes, dye precursors and thermal polymerization inhibitors are produced in such storage-stable solutions.

They are particularly suitable for the production of offset printing plates.

4 Claims, No Drawings

STORAGE-STABLE SOLUTION OF A CARBOXYL-CONTAINING COPOLYMER AND PRODUCTION OF PHOTOSENSITIVE COATINGS AND OFFSET PRINTING PLATES

The present invention relates to storage-stable solutions of carboxyl-containing copolymers, some of whose carboxyl groups have been reacted with glycidyl (meth)acrylate, and processes for the production of photosensitive coatings and offset printing plates using these storage-stable solutions.

Photopolymerizable mixtures are widely used, for example in the production of photocurable surface coatings, coatings, printing inks, protective and resist layers, photopolymer printing plates, copying films and the like. An essential requirement for these photopolymerizable mixtures is that they have very high photosensitivity, i.e. the photopolymerization or photocuring induced on exposure to actinic light takes place very rapidly regardless of other effects. This requirement applies in particular to the use of photopolymerizable mixtures for optical information fixing and in the reproduction sector, since here the duration of photopolymerization decisively influences the total processing time.

It is known that, owing to its inhibitory action on free radical polymerization, oxygen reduces the sensitivity of photopolymeric mixtures.

This applies in particular to offset printing, since layer thicknesses of 1–5 μm are usual there. DE-A-3 037 521 describes a photopolymerizable material which contains an ethylenically unsaturated, photopolymerizable compound, a polymeric binder, a photopolymerization initiator and an amino-containing s-triazine compound. The photopolymerization initiators mentioned include anthraquinone and derivatives thereof, benzophenone and derivatives thereof, such as Michler's ketone, and combinations of these compounds. The amino-containing s-triazine compound is used here for improving the adhesion of the photopolymerizable material to a substrate.

Mixing oxygen acceptors with photopolymerizable mixtures to suppress the oxygen inhibition during photopolymerization has also been proposed. It is consequently often possible to have a positive effect on the photopolymerization. For example, 1,3-diphenylisobenzofuran is an efficient oxygen acceptor for certain photopolymerizable mixtures (cf. for example Photographic Sci. Eng. 23 (1979), 137–140).

Often the desired photosensitivity can be achieved only by applying an oxygen-impermeable top layer to the photosensitive mixture. However, in the case of photosensitive recording elements having thin photopolymerizable layers, as used, inter alia, in the production of resist layers and lithographic printing plates, where the top oxygen-barrier layer is generally thicker than the photopolymerizable layer of photosensitive recording elements, such top layers reduce the resolution.

EP-A 234 570 describes a system which has high photosensitivity even without an oxygen barrier. The combination of Michler's ketone with an acid donor, such as bis-(trichloromethyl)-styrene-s-triazine, as a photoinitiator system in conjunction with one or more ethylenically unsaturated, photopolymerizable compounds has proven particularly advantageous, in particular the combination of carboxyl-containing (meth) acrylate copolymers, in which some of the carboxyl groups have been esterified with glycidyl methacrylate (=functionalized polymer), with one or more polyethylenically unsaturated acrylate monomers.

A disadvantage of these photosensitive crosslinkable mixtures based on functionalized binders (which have been crosslinked by free radical copolymerization) is that these reactive binders and the mixtures prepared therefrom tend to exhibit a sharp increase in viscosity on prolonged storage in solution. Furthermore, the increase in viscosity could not be markedly delayed even by the addition of thermal polymerization inhibitors.

Because of this limited shelf life, it was necessary for the functionalized polymer to be precipitated immediately after its preparation in a large excess of water, filtered off and dried and stored as a powder until shortly before its use as a binder for photosensitive mixtures for offset printing plates. This process is very time-consuming and expensive, and moreover the large amount of wastewater obtained has to be disposed of.

It is an object of the present invention to find a method for stabilizing such reactive polyacrylates by means of suitable additives so that their solution can be stored over a period of several months under normal conditions without an increase in viscosity. The measures to this end must not have an adverse effect on the requirements set for a photopolymerizable coating or a photopolymerizable offset printing plate, such as high photosensitivity without an oxygen barrier layer, easy development of the unexposed parts and high mechanical abrasion resistance of the photocured layer.

This object is achieved, surprisingly, by the addition of a phosphoric ester of a hydroxyalkyl (meth)acrylate.

Phosphoric esters of acrylates and their preparation by reacting 2-hydroxyethyl (meth)acrylate with $P_2O_5$ are disclosed in U.S. Pat. No. 3,686,371.

U.S. Pat. No. 3,867,351 describes phosphoric esters of (meth)acrylates of electrically conductive compositions while U.S. Pat. No. 3,754,972 describes said esters as adhesion promoters. Coating compositions which contain phosphoric esters of acrylates and can be polymerized with ionizing radiation are described in U.S. Pat. No. 3,984,500. DE-C-26 16 946 describes anaerobically curable adhesives to which not less than 0.05% by weight of a phosphoric ester of an acrylate has been added.

The present invention relates to a storage-stable solution of a film-forming carboxyl-containing copolymer, from 5 to 80% of whose carboxyl groups have been reacted with glycidyl (meth)acrylate, in an inert organic solvent or solvent mixture, wherein the solution additionally contains from 1 to 50% by weight, based on the carboxyl-containing, polymeric reaction product, of a phosphoric ester of a hydroxyalkyl (meth)acrylate and, if required, orthophosphoric acid.

The present invention furthermore relates to a process for the production of photosensitive coatings which contain one or more photoinitiators, one or more ethylenically unsaturated organic monomeric compounds which can be subjected to free radical polymerization and, if required, plasticizers, dyes, dye precursors and thermal polymerization inhibitors, wherein the production of these coatings is carried out in a novel storagestable solution.

The invention also relates to a process for the production of offset plates, in which a photosensitive coating prepared according to the invention is used for the production of the photosensitive layer.

As a result of the addition, according to the invention, of phosphoric esters of a hydroxyalkyl (meth)acrylate, the viscosity of the solutions of film-forming carboxyl-containing copolymers, some of whose carboxyl groups have been reacted with glycidyl (meth)acrylate, can be kept constant over a prolonged period of from about 6 to 12 months. The solution stabilized in this manner can very advantageously be used as a basis for the production of a photopolymerizable coating for the production of offset printing plates. Surprisingly, the photosensitive layer produced therewith also results in improved storage stability (=retention of the hydrophilicity of the substrate during development) of the photopolymer offset printing plate.

Regarding the components of the novel solutions and their further processing, the following may be stated specifically.

Suitable phosphoric esters of a hydroxyalkyl (meth)acrylate are those of the general formula

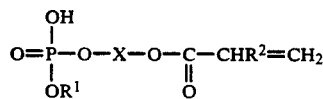

where $R^1$ is H, $R^2$ is H or $CH_3$ and X is $(CH_2)_n$ in which n is from 1 to 4, preferably 2.

The esterification products of phosphoric acid with hydroxyethyl acrylate or hydroxyethyl methacrylate in a molar ratio of 1:1 are preferred.

Esterification products of phosphoric acid with hydroxyethyl (meth)acrylate in a molar ratio of 1:2 and mixtures thereof with orthophosphoric acid are also suitable.

The phosphoric esters of hydroxyalkyl (meth)acrylates are present in the novel mixture in an amount of from 1 to 50, preferably from 5 to 20, % by weight, based on a film-forming carboxyl-containing copolymer modified with glycidyl (meth)acrylate.

Suitable film-forming carboxyl-containing copolymers which are used as starting materials for modification with glycidyl (meth)acrylate are copolymers of acrylic acid or methacrylic acid, preferably copolymers of acrylic acid and/or methacrylic acid with methyl methacrylate, and some of the methyl methacrylates may furthermore be replaced by other carboxyl-free copolymerizable ethylenically unsaturated organic compounds, for example vinylaromatics, such as styrene, or esters of acrylic acid with alkanols of 1 to 8, in particular 1 to 4, carbon atoms, e.g. methyl acrylate, ethyl acrylate, isopropyl acrylate, n-butyl acrylate and/or isobutyl acrylate.

Copolymers of from 50 to 80, in particular from 65 to 75, % by weight of methyl methacrylate and 20 to 50, in particular from 25 to 35, % by weight of acrylic acid and/or methacrylic acid, which have K values (according to Fikentscher) of from 20 to 50, are particularly preferred. They can be prepared by conventional free radical copolymerization of monomers by customary processes, for example by solution polymerization in inert organic solvents, such as ketones and ethers, e.g. acetone, tetrahydrofuran, glycol ethers, in particular diethylene glycol dimethyl ether, in the presence of free radical initiators, for example azobisisobutyronitrile and organic peroxides.

These carboxyl-containing copolymers are reacted with glycidyl acrylate and/or glycidyl methacrylate in amounts such that from 5 to 80, preferably from 30 to 60, % of the carboxyl groups originally present in the carboxyl-containing copolymer are converted with glycidyl (meth)acrylate. This reaction is usually carried out in an inert organic solvent or solvent mixture, for example in an ether, e.g. diethylene glycol dimethyl ether, at from 50° to 140° C., for example at 1100° C., advantageously in the presence of an inhibitor (e.g. Xyligene ® A1 from BASF Aktiengesellschaft or hydroquinone monomethyl ether) and of an esterification catalyst, e.g. tetrabutylammonium iodide, dimethylaminopyridine or N-methylimidazole.

Suitable inert organic solvents or solvent mixtures are the abovementioned ones. Preferred solvents are those in which both polymerization and functionalization (=reaction with glycidyl (meth)acrylate) can be carried out. Other preferred inert solvents are mixtures of tetrahydrofuran and diethylene glycol dimethyl ether or of acetone and diethylene glcyol dimethyl ether.

The novel storage-stable solutions have a constant viscosity over a long period and are suitable for the production of photopolymerizable coatings, in particular for the production of photopolymer offset printing plates.

A large number of compounds are suitable photoinitiators capable of initiating the polymerization of the ethylenically unsaturated compounds in the photopolymerizable mixtures on exposure to actinic light. These include, for example, benzoin ethers, benzil ketals, benzoylacylphosphine oxide compounds, polynuclear quinones, anthraquinone and its derivatives, benzophenone and its derivatives, thioxanthones, s-triazine derivatives containing one or more halomethyl groups, hexaarylbisimidazoles and others. A list of a large number of photopolymerizable systems with a very wide range of photoinitiators appears in, for example, the article Photopolymersysteme und ihre Anwendungen by H.-J. Timpe and H. Baumann, Chemische Technik 36 (1984), 1–7. To improve the photosensitivity of the photopolymerizable mixtures, it is also possible to use combinations of photoinitiators or of a photoinitiator and a sensitizer. A known and very widely used photoinitiator system of this type is the combination of benzophenone and Michler's ketone (cf. inter alia DE-A-1 522 359). In general, amino-containing compounds are used as sensitizers for photoinitiators (cf. for example EP-A-138 187 and GB-A-2 083 832). Furthermore, for example, DE-A-2 934 758, U.S. Pat. No. 4,239,850 and JP-A-55050001 describe mixtures of s-triazines containing one or more halomethyl groups with certain dialkylamino-containing aromatic carbonyl compounds or N-heteroaromatic carbonyl compounds as photoinitiator combinations.

Suitable ethylenically unsaturated, photopolymerizable monomers for the novel photopolymerizable mixture for the production of photosensitive coatings are in principle all ethylenically unsaturated monomers which are accessible to a photoinitiated polymerization or crosslinking reaction. These include both monomers and ethylenically unsaturated, photopolymerizable oligomers and corresponding unsaturated polymers. The monomers generally have a molecular weight of less than 1,000. Ethylenically unsaturated, photopolymerizable compounds with photopolymerizable double bonds are activated by, for example, aryl, carbonyl, amido, ester, carboxyl or nitrile groups, halogen atoms or C—C double or C—C triple bonds are preferred. The ethylenically unsaturated, photopolymerizable compounds may be either monofunctional or polyfunctional, i.e. they may contain one or more photopolymerizable, ethylenic double bonds. Particularly when they are used for the production of photosensitive recording elements, the photopolymerizable mixtures usually contain bifunctional or polyfunctional ethylenically unsaturated photopolymerizable compounds alone or mixtures thereof with a minor amount of monofunctional, ethylenically unsaturated, photopolymerizable compounds. The ethylenically unsaturated, photopolymerizable compounds which are present alone or as a mixture with one another, are sufficiently described in the relevant literature. Their choice in terms of type and amount depends in particular on the intended use of the photopolymerizable mixtures and is familiar to the skilled worker.

The ethylenically unsaturated, photopolymerizable monomers include, for example, the vinyl compounds, such as vinyl ethers, vinyl esters, styrene, vinyl chloride, vinylidene chloride, vinyl ketones, vinyl sulfones, N-vinylpyrrolidone, N-vinylcaprolactam and N-vinylcarbazole, as well as allyl esters, such as diallyl phthalate. The acryloyl- and/or methacryloyl-containing monomers are particularly advantageous. These include in particular the esters of acrylic acid and methacrylic acid, for example the di- and tri(meth)acrylates of dihydric or polyhydric alcohols, for example of ethylene glycol, diethylene glycol, triethylene glycol or polyethylene glycols having a molecular weight of up to about 500, 1,2-propanediol, 1,3-propanediol, polypropylene glycols having a molecular weight of up to about 500, 1,4-butanediol, 1,1,1-trimethylolpropane, 2,2-dimethylpropanediol, glycerol or pentaerythritol and pentaerythrityl tetra(meth)acrylate; the monoacrylates and monomethacrylates of the stated diols or polyols, e.g. ethylene glycol mono(meth)acrylate or di-, tri- or tetraethylene glycol mono(meth)acrylate, propanediol mono(meth)acrylate and butanediol mono(meth)acrylate; the (meth)acrylates of monoalkanols, in particular of those having 1 to 20 carbon atoms; (meth)acrylamide, N-methylol(meth)acrylamide, methylenebis(meth)acrylamide, the bisethers of ethylene glycol and of N-methylol(meth)acrylamide; urethane acryldtes and methacrylates having 2 or more acryloyl or methacryloyl groups, its can be prepared, for example, by reacting organic di- or polyisocyanates with monohydroxy (meth)acrylate, in particular hydroxydlkyl (meth)acrylates; (meth)acrylate monomers having 2 or more acryloyl and/or methacryloyl groups,, as can be obtained by reacting acrylic acid and/or methacrylic acid with di- or polyglycidyl compounds, in particular di- or polyglycidyl ethers, for example the reaction product of 2 mol of acrylic acid and/or methacrylic acid with 1 mol of bisphenol A bisglycidyl ether.

The particularly preferred photopolymerizable ethylenically unsaturated monomers include trimethylolpropane triacrylate, trimethylolpropane trimethacrylate, pentaerythrityl tri- and tetraacrylate, pentaerythrityl tri- and tetramethacrylate and monomeric epoxy(meth)acrylates of the abovementioned type, for example ethoxylated bisphenol A diacrylate.

In addition to the photoinitiators and the ethylenically unsaturated, photopolymerizable compounds, the novel photopolymerizable mixtures for the production of coatings may contain further additives and/or assistants, in particular for improving or modifying the performance characteristics and/or processing properties. Additives and/or assistants of this type include thermal polymerization inhibitors, dyes and/or pigments, fillers, film-forming nonphotopolymerizable and nonphotocrosslinkable polymers, plasticizers, leveling agents, dulling agents or lubricants, reinforcing agents, UV stabilizers, photochromic systems, sensitizers and the like. Where they are present, these additives are contained in the photopolymerizable mixtures in effective amounts conventionally used for these substances and familiar to the skilled worker. If, in addition to the ethylenically unsaturated, photopolymerizable compounds, the photopolymerizable mixtures contain film-forming, nonphotopolymerizable and nonphotocrosslinkable polymeric binders, for example polyamides, vinyl alcohol polymers, partially hydrolyzed polyvinyl acetate, polyurethanes, (meth)acrylate (co)polymers, styrene (co)polymers and the like, and if the photopolymerizable mixtures are to be used for the production of photosensitive coatings or recording elements, these film-forming polymeric binders are chosen so that they are compatible with the ethylenically unsaturated, photopolymerizable compounds.

Suitable thermal polymerization inhibitors, which may be present in the photopolymerizable mixtures for the production of coatings, are, for example, hydroquinone, hydroquinone derivatives, 2,6-di-tert-butyl-p-cresol, nitrophenols, N-nitrosodiphenylamine or the salts of N-nitrosocyclohexylhydroxylamine. Examples of dyes and/or pigments, which may both act as a contrast medium and have a layer-consolidating action, include Brilliant Green Dye (C.I. 42,040), Victoria Sky Blue FGA, Victoria Sky Blue BO (C.I. 42,595), Victoria Blue B (C.I. 44,045), Rhodamine 6G (C.I. 45,160) and other photochromic systems which change their color reversibly or irreversibly on exposure to actinic light without interfering with the photopolymerization process, are, for example, leuko dyes together with suitable activators or photochemical oxidizing agents. When used in photosensitive recording elements, photopolymerizable mixtures may also contain sensitometric regulators, for example 9-nitroanthracene, 10,10'-bisanthrone, phenacinium, phenoxacinium, acridinium or phenothiacinium dyes, in particular in combination with mild reducing agents, 1,3-dinitrobenzenes and the like.

The photopolymerizable mixtures prepared using the novel storage-stable solutions are very versatile and are particularly suitable for the production of thin photocurable layers, for example having a thickness of from about 0.1 to 50 μm, in particular for offset printing plates. They may be used in a conventional manner for the production of photocurable coatings, for surface coatings serving protective or decorative purposes on any substrates, e.g. metals, wood, plastics, glass, paper or board, or for the production of impregnating materials or of photocurable printing inks. The usual sources of actinic light, in particular those whose emissions maxima are from 300 to 420 nm, are suitable for curing and photopolymerization.

The novel photopolymerizable mixtures are particularly advantageous for the production of photosensitive recording elements having thin, photosensitive, photopolymerizable recording layers, as conventionally employed in the reproduction sector not only as a photoresist but in particular for the production of lithographic printing plates.

These photosensitive recording elements contain a photosensitive, photopolymerizable recording layer applied to a dimensionally stable substrate and consisting of a photopolymerizable mixture prepared according to the invention. The photopolymerizable recording layer of these photosensitive recording elements usually has a thickness of from about 0.1 to 50 μm. While thicker recording layers are suitable for photoresist films, for example from 5 to 50 μm, the thickness of the photopolymerizable recording layer for lithographic printing plates is preferably from 0.5 to 8 μm, in particular from 0.7 to 3.5 μm.

Suitable substrates for such photopolymerizable recording layers are the dimensionally stable, rigid or flexible substrates conventionally used for photosensitive recording elements, the type of substrate depending on the intended use of the photosensitive recording elements. Suitable dimensionally stable substrates are in particular plastics films or sheets, for example of polyethylene terephthalate, and metallic substrates, e.g. aluminum, steel, copper, brass or zinc foils, which may be pretreated in the usual manner for offset printing plates (cf. for example Wernick, Pinner, Zurbrügg and Weiner, Die Oberflächenbehandlung von Aluminium, Eugen G. Lenze Verlag, 1977).

In the Examples which follow, parts and percentages are by weight, unless stated otherwise.

Preparation of the modified carboxyl-containing copolymer 70 parts of methyl methacrylate and 30 parts of methacrylic acid (=MAA) were copolymerized in diethylene glycol dimethyl ether by means of azobisisobutyronitrile (30% strength solution). The reaction mixture was kept at 80° C. until all initiator had reacted. The mixture was then diluted to a solids content of 10% with diethylene glycol dimethyl ether, and 0.1%, based on the solids content, of hydroquinone monomethyl ether was added. Thereafter, some of the carboxyl groups of the copolymer were esterified with glycidyl methacrylate. 0.66 mol of glycidyl methacrylate was added per mol, based on the methacrylic acid content of the copolymer. The esterification catalyst used was tetrabutylammonium iodide.

The esterification was carried out to an acid number of 75 mg of KOH/g of polymer.

This solution of the modified copolymer was used to investigate the efficiency of various additives with regard to their ability to stabilize.

| COMPARATIVE EXAMPLES 1 TO 3 AND EXAMPLE 4 according to the invention: | |
| --- | --- |
| Modified copolymer solution | Additive (%, based on solids) |
| 1 (comparison) | — |
| 2 (comparison) | with 1% of hydroquinone monomethyl ether |
| 3 (comparison) | with 1% of Xyligen Al |
| 4 (according to the invention) | with 10% of methacryloxyethyl phosphate (e.g. Kayamer ® PM-1 from Nippon Kayaku) |

| Investigation of the storage stability: | | | | | |
| --- | --- | --- | --- | --- | --- |
| Modified copolymer solution | Viscosity [mm²/s] after weeks of storage at 25° C. (Ubbelohde viscometer) | | | | |
| | 0 | 5 | 18 | 30 | 52 |
| 1 (comparison) | 14.9 | 18.9 | 21.0 | 24.5 | 30.5 |
| 2 (comparison) | 14.9 | 18.7 | 20.9 | 24.5 | 30.4 |
| 3 (comparison) | 14.9 | 19.0 | 21.0 | 24.4 | 29.8 |
| 4 (according to the invention) | 12.4 | 12.4 | 12.5 | 12.6 | 12.6 |

Production of a photopolymerizable offset printing plate based on the polymer solutions stored for different times An anodically oxidized aluminum sheet roughened electrochemically by treatment with alternating current in an aqueous HCl solution and having an oxide weight of 3 g/cm² was immersed for 30 seconds in a solution containing 0.1% by weight of $K_2ZrF_6$ and 0.5% by weight of 2-(trihydroxysilyl)ethylphosphonic acid and then washed thoroughly with demineralized water.

The substrates produced in this manner were coated with various photosensitive coatings so that the layer weight was 2.5 g/cm².

The photosensitive coatings have the following composition:

a)* 59% of modified copolymer according to Comparative Examples 1–3
  30% of monomer (aromatic defunctional acrylate=ethoxylated bisphenol A, reacted with 2 mol equivalents of acrylic acid, e.g. Photomer ® 4028 from Henkel USA)
  2% of Michler's ketone
  6% of 2-(4-methoxynaphth-1-yl)-4,6-bis-(trichloromethyl)-s-triazine
  1% of bromophenol blue and
  2% of plasticizer (N-n-butylbenzenesulfonamide)

b)* 59% of modified copolymer additionally containing, according to the invention,
  6% of methacryloxyethyl phosphate
  24% of monomer (as for a) remaining components as for a)

*) %=Percent by weight, based on solids content The solutions have a solids content of 14.5% in diethylene glycol dimethyl ether These modified copolymer solutions containing different additives are stored for 0, 5, 18, 30 and 52 weeks before being used for the production of offset printing plates. These printing plates were subjected to an accelerated storage test in a conditioned chamber (60° C., 50% atmospheric humidity) and developed at regular intervals with an aqueous alkaline developer (Nylolith ® EN10 from BMF). The developed printing plates were then inked with offset printing ink. The storage time after which the substrate surface tended to accept ink as a result of insufficient developability of the photosensitive layer was determined. Experiments to determine the effects of stored binder solutions on the properties of offset printing plates produced therewith Ink acceptance problems of the developed offset printing plates after days on using the binder solutions stored at room temperature (0, 5, 18, 30 and 52 weeks). Storage conditions of the offset printing plates: 600° C., 55% humidity

| Binder solutions | Storage time of the binder solutions in weeks | | | | |
| --- | --- | --- | --- | --- | --- |
| | 0 | 5 | 18 | 30 | 52 |
| | Ink acceptance problems of the developed offset printing plates after days in the conditioned chamber | | | | |
| Comparative Example 1 | 6 | 5 | 2 | 0* | 0* |
| Comparative Example 2 | 6 | 5 | 2 | 0* | 0* |
| Comparative Example 3 | 6 | 4 | 2 | 0* | 0* |
| Example 4 according to the invention | 15 | 15 | 14 | 14 | 13 |

*Ink acceptance problems occurring even in freshly produced printing plate not stored in the conditioned chamber (satisfactory development impossible)

Samples of the printing plates from Comparative Examples 1 to 3 and from Example 4 according to the invention were exposed imagewise to a high pressure mercury lamp and developed before being used for a print run on a printing press (Heidelberg GTO sheet-fed offset printing press). A print run of 200,000 sheets could be achieved with all printing plates without visible signs of wear of the printing layer.

We claim:

1. A process which comprises 1) preparing a solution by reacting a film-forming carboxyl-containing copolymer with a glycidyl (meth)acrylate in an inert organic solvent or solvent mixture, in the presence of 1–50% by weight, based on the carboxyl-containing polymeric reaction product, of a phosphoric ester of a hydroxyalkyl (meth)acrylate, from 5 to 80% of the carboxyl groups being reacted with the glycidyl (meth)acrylate, 2) combining the solution from step 1) with at least one photoinitiator and at least one ethylenically unsaturated organic monomeric compound to form a photosensitive coating, and 3) applying the photosensitive coating to a thickness of from 0.5 to 8 $\mu$m on a dimensionally stable substrate to form a photopolymerizable recording layer on the substrate.

2. The process of claim 1, wherein, in step 2), the combination further contains a member selected from the group consisting of a plasticizer, a dye, a dye precursor, a thermal polymerization inhibitor, and mixtures thereof.

3. The process of claim 1, wherein, in step 1), an orthophosphoric acid is present.

4. The process of claim 1, wherein the dimensionally stable substrate is an anodically oxidized and electrochemically roughened aluminum sheet.

* * * * *